US008777636B2

(12) United States Patent
Kanda

(10) Patent No.: US 8,777,636 B2
(45) Date of Patent: Jul. 15, 2014

(54) COAXIAL CONNECTOR FOR BOARD, PAIR OF CHAIN TERMINALS AND METHOD OF MANUFACTURING COAXIAL CONNECTOR FOR BOARD

(75) Inventor: Hidenori Kanda, Makinohara (JP)

(73) Assignee: Yazaki Corporation, Tokyo (JP)

( * ) Notice: Subject to any disclaimer, the term of this patent is extended or adjusted under 35 U.S.C. 154(b) by 125 days.

(21) Appl. No.: 13/505,870

(22) PCT Filed: Nov. 5, 2010

(86) PCT No.: PCT/JP2010/069756

§ 371 (c)(1), (2), (4) Date: May 3, 2012

(87) PCT Pub. No.: WO2011/055805

PCT Pub. Date: May 12, 2011

(65) Prior Publication Data

US 2012/0225570 A1 Sep. 6, 2012

(30) Foreign Application Priority Data

Nov. 6, 2009 (JP) ................................ 2009-255276

(51) Int. Cl.
*H01R 12/00* (2006.01)
*H05K 1/00* (2006.01)

(52) U.S. Cl.
USPC .............................. 439/63; 439/581; 439/885

(58) Field of Classification Search
USPC ........................................... 439/63, 581, 885
See application file for complete search history.

(56) References Cited

U.S. PATENT DOCUMENTS

| | | | | |
|---|---|---|---|---|
| 3,654,594 | A * | 4/1972 | Sitzler | 439/857 |
| 4,598,961 | A | 7/1986 | Cohen | |
| 5,741,159 | A | 4/1998 | Wright | |
| 5,851,121 | A | 12/1998 | Thenaisie et al. | |
| 6,837,748 | B2 * | 1/2005 | Aldridge | 439/660 |
| 8,430,675 | B2 * | 4/2013 | Hardy et al. | 439/63 |
| 2005/0221631 | A1 | 10/2005 | Yamaguchi | |
| 2012/0135648 | A1 * | 5/2012 | Morikawa | 439/885 |

FOREIGN PATENT DOCUMENTS

| | | | |
|---|---|---|---|
| JP | 10-32048 | A | 2/1998 |
| JP | 2007-122900 | A | 5/2007 |
| JP | 2008-059761 | A | 3/2008 |
| WO | 2006/057302 | A1 | 6/2006 |

OTHER PUBLICATIONS

Communication from the European Patent Office issued Jun. 5, 2013 in counterpart European Application No. 10828364.9.
International Search Report for PCT/JP2010/069756 dated Dec. 7, 2010 [PCT/ISA/210].
Written Opinion for PCT/JP2010/069756 dated Dec. 7, 2010 [PCT/ISA/237].

* cited by examiner

*Primary Examiner* — Hae Moon Hyeon
(74) *Attorney, Agent, or Firm* — Sughrue Mion, PLLC

(57) ABSTRACT

Manufacturing efficiency of a connector is greatly improved, and the manufacturing costs and the product cost can be reduced. A coaxial connector (P) for a board of the present invention is configured so that an extended portion of an outer terminal (42) and an extended portion of an inner terminal (44) are positioned so that one extended portion is not superimposed on the other extended portion when a half-cylinder portion of the outer terminal is viewed from an upper side.

3 Claims, 9 Drawing Sheets

COAXIAL CONNECTOR FOR BOARD, PAIR OF CHAIN TERMINALS AND METHOD OF MANUFACTURING COAXIAL CONNECTOR FOR BOARD

TECHNICAL FIELD

The present invention is related to a coaxial connector for a board attached to a printed board, a pair of chain terminals used for the coaxial connector for the board, and a method of manufacturing the coaxial connector for the board.

BACKGROUND ART

As a shield connector for a board of the conventional art attached to the printed board, a connector shown in FIG. 18 is known. The shield connector 10 for the board is configured such that a connector terminal 14, in which an inner conductor terminal 11 soldered to a signal pattern on a printed board is held in an inner portion of a dielectric body 12, and an outer conductor terminal 13 accommodates the dielectric body 12, is accommodated in a connector housing 15 made of resin. A signal line of a shield electric wire (not shown) is connected to the inner conductor terminal 11, and a high frequency signal is transmitted to the inner conductor terminal 11. The outer conductor terminal 13 is connected to a shield line of the shield electric wire, and covers and electromagnetically shields the periphery of the inner conductor terminal 11.

The inner conductor terminal 11 is formed in a substantially inverted L shape in which a suspended portion 17 is suspended downward from a proximal end of a pin-shaped horizontal portion 16, by punching a conductive plate member. The proximal end side of the pin-shaped horizontal portion 16 is formed to have a diameter slightly greater than the tip side thereof, and includes a locking protrusion 18. Moreover, the tip side of the horizontal portion 16 is connected to the inner conductor terminal of an opposite side shield connector (not shown), and the tip side of the suspended portion 17 is connected to a desired signal pattern of printed board, whereby the delivery of the electric signal between the shield electric wire and the printed board is performed.

The dielectric body 12, in which the inner conductor terminal 11 is accommodated, is formed by an insulating material made of resin having a predetermined dielectric constant, is assembled between the inner conductor terminal 11 and the outer conductor terminal 13, and sets the portion between these terminals to an insulated state. The dielectric body 12 is formed with an accommodation chamber 20 having an elongated opening surface 19 in an inner portion thereof, and a horizontal cylinder portion 21 is extended and formed in the front side of the accommodation chamber 20.

An insertion hole 22, into which the pin-shaped horizontal portion 16 of the inner conductor terminal 11 is inserted, is opened and formed in the inner portion of the horizontal cylinder portion 21 in the front and back direction, and the back side thereof communicates with the accommodation chamber 20. When the horizontal portion 16 of the inner conductor terminal 11 is inserted into the insertion hole 22, the horizontal portion 16 is pressed by the locking protrusion 18 bulged to the proximal end side having a diameter slightly greater than the tip side, and the inner conductor terminal 11 is held in the dielectric body 12.

After releasing the conductive plate member, the outer terminal 13 is formed in a cylindrical shape by the bending processing using a press or the like, and the dielectric body 12 is able to be accommodated in the accommodation chamber 23 of the inner portion. The front tip portion is a fitting portion

24 fitted to the outer conductor terminal of the opposite side shield connector, and the tip of the horizontal portion 16 of the inner conductor terminal 11 inserted into the insertion hole 22 of the dielectric body 12 accommodated to the accommodation chamber 23 is projected from the dielectric body 12 and is placed in the fitting portion 24.

On an upper surface of a middle portion of the outer conductor terminal 13, a locking piece 25 is projected so as to be possible to be flexural-deformed upward. On an upper surface rear end of the outer conductor terminal 13, a folded piece 27 having a size covering the back opening portion 26 is extended and formed. The folded piece 27 covers the dielectric body 12 accommodated in the accommodation chamber 23 of the outer conductor terminal 13 from the back by being folded downward to block the back opening portion 26, whereby it is possible to prevent degradation of the shield performance of the shield connector 10 for the board.

Two connection portions 28 electrically connected to a ground pattern of the printed board are extended downward to the rear part of the outer conductor terminal 13. The connection portions 28 have a pair of elastic connection pieces 30 and 30 that is formed with a slit-shaped gap portion and branches from the proximal end to the tip. Locking portions 31 bulge from the tips of the pair of elastic connection pieces 30 and 30, and can be locked with an opening edge of a through hole that is electrically connected to the ground pattern of the printed board (for example, see PTL 1).

In this manner, the shield connector 10 for the board is configured so that the inner conductor terminal 11 is formed by punching the conductive plate member, and the outer conductor terminal 13 is formed by being folded by a press after releasing the conductive plate member. Moreover, the inner conductor terminal 11 is held in the dielectric body 12, the dielectric body 12 is accommodated in the accommodation chamber 23 of the outer conductor terminal 13, and the horizontal portion 16 of the inner conductor terminal 11 is inserted into and protrudes from the insertion hole of the dielectric body 12, so that the shield connector 10 for the board is assembled.

CITATION LIST

Patent Literature

[PTL 1] JP-A-2008-59761

SUMMARY OF INVENTION

Technical Problem

The shield connector for the board mentioned above has the following problems to be solved.

That is, the press molding of one each of the inner conductor terminal 11 and the outer conductor terminal 13 (total of two), one each of the resin molding of the dielectric body 12 and the connector housing 15 (total of two), and one each of the pressure-fitting of the inner conductor terminal 11 to the dielectric body 12, the pressure-fit of the dielectric body 12 to the outer conductor terminal 13, and the pressure-fit of the outer conductor terminal 13 to the connector housing 15 (total of three) are needed. Consequently, there is a disadvantage in that efficiency of the connector manufacturing is poor due to an increase in number of processes, and increases in the assembly cost and the product cost are inevitable.

The present invention has been made in view of the circumstances mentioned above, and an object thereof is to provide a coaxial connector for a board that is able to improve manufacturing efficiency of the connector and thus is able to promote reductions in the assembly cost and the product cost, a pair of chain terminals used for the coaxial connector for the board, and a manufacturing method of manufacturing the coaxial connector for the board.

Solution to Problem

In order to achieve the object mentioned above, the coaxial connector for the board according to the present invention is characterized by (1) as described below.

(1) A coaxial connector for a board, configured to be attached to a printed board, the coaxial connector comprising:

an outer terminal;

an inner terminal; and an insulating material positioned between the outer terminal and the inner terminal and on an outside of the outer terminal, wherein the outer terminal includes a half-cylinder portion in which a part of a lower side thereof is removed, and an extended portion which is extended from the half-cylinder portion toward the printed board in a state where the coaxial connector is attached to the printed board, the inner terminal includes a main body portion which can be accommodated into the half-cylinder portion of the outer terminal through the part of the lower side thereof, and an extended portion which is extended from the main body portion toward the printed board in the state where the coaxial connector is attached to the printed board, and the extended portion of the outer terminal and the extended portion of the inner terminal are in positions where one extended portion is not superimposed on the other extended portion when the half-cylinder portion of the outer terminal is viewed from an upper side.

In order to achieve the object mentioned above, pair of chain terminals according to the present invention is characterized by (2) as described below.

(2) A pair of chain terminals, comprising:

a first chain terminal in which an outer terminal is extended from a first carrier in a chain shape; and a second chain terminal in which an inner terminal is extended from a second carrier in a chain shape, wherein the outer terminal has a half-cylinder portion in which a part of a lower side thereof is removed, and an extended portion which is extended from the half-cylinder portion toward the first carrier, the inner terminal has a main body portion which can be accommodated into the half-cylinder portion of the outer terminal through the part of the lower side thereof, and an extended portion which is extended from the main body portion toward the second carrier, and in a state where the first chain terminal and the second chain terminal are stacked so that the second carrier is positioned on the lower side of the first carrier, the main body portion of the inner terminal is accommodated in the half-cylinder portion of the outer terminal, and the extended portion of the outer terminal and the extended portion of the inner terminal are in a position where one extended portion is not superimposed on the other extended portion when viewing the half-cylinder portion of the outer terminal from an upper side.

In order to achieve the object mentioned above, the manufacturing method of manufacturing the coaxial connector for the board according to the present invention is characterized by (3) as described below.

(3) A manufacturing method of manufacturing a coaxial connector for a board to be attached to a printed board, from a first chain terminal in which an outer terminal having a half-cylinder portion with a part of a lower side removed and an extended portion extended from the half-cylinder portion toward a first carrier is extended from the first carrier in a chain shape, and a second chain terminal in which an inner terminal having a main body portion capable of being accommodated into the half-cylinder portion of the outer terminal through a part of a lower side thereof and an extended portion extended from the main body portion toward a second carrier is extended from the carrier in a chain shape, the manufacturing method comprising:

accommodating the main body portion of the inner terminal into the half-cylinder portion of the outer terminal, by stacking the first chain terminal and the second chain terminal so that the second carrier is positioned on the lower side of the first carrier;

storing the first chain terminal and the second chain terminal in a mold so as to surround the half-cylinder portion of the outer terminal and a periphery of the main body portion of the inner terminal, and sandwich the extended portion of the outer terminal and the extended portion of the inner terminal, which are in a position where one of the two extended portions is not superimposed on the other of the two extended portions in a state where the half-cylinder portion of the outer terminal is viewed from an upper side, from a vertical direction, respectively;

injecting an insulating material into the mold in which the first chain terminal and the second chain terminal are stored to perform a hoop molding; and cutting the extended portion of the outer terminal and the extended portion of the inner terminal.

With the coaxial connector for the board of the configuration of (1), the pair of chain terminals of the configuration of (2), and the manufacturing method of manufacturing the coaxial connector for the board of the configuration of (3), a coaxial connector with a carrier is effectively and simply obtained by one hoop molding of the inner terminal with the carrier and the outer terminal with the carrier, and it is possible to simply and cheaply manufacture the coaxial connector, without requiring multiple injection works of the terminal and the housing as in the related art.

Advantageous Effects of Invention

According to the present invention, it is possible to improve the manufacturing efficiency of the connector, and promote a reduction in the assembly cost and the product cost.

As mentioned above, the present invention has been briefly described. In addition, by reading through the embodiments for carrying out the invention described below with reference to the drawings, the details of the present invention are further clarified.

DESCRIPTION OF EMBODIMENTS

Figure 1:
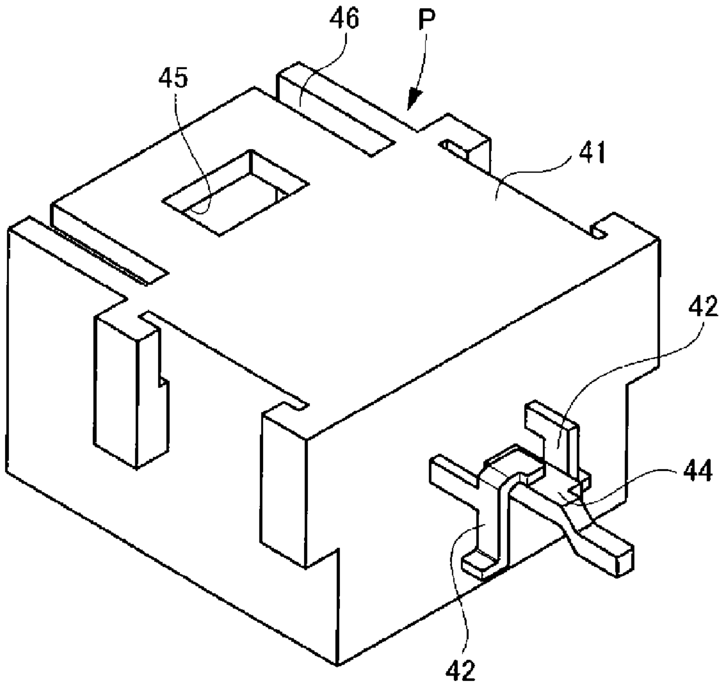
FIG. 1 is a perspective view that shows a coaxial connector for a board according to an embodiment of the invention.
Figure 2:
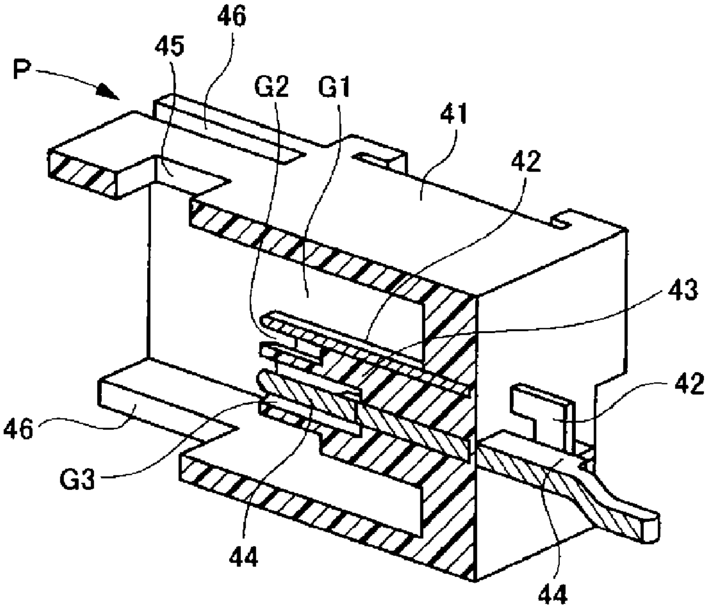
FIG. 2 is a longitudinal cross-sectional perspective view of the coaxial connector for the board shown in FIG. 1.
Figure 3:
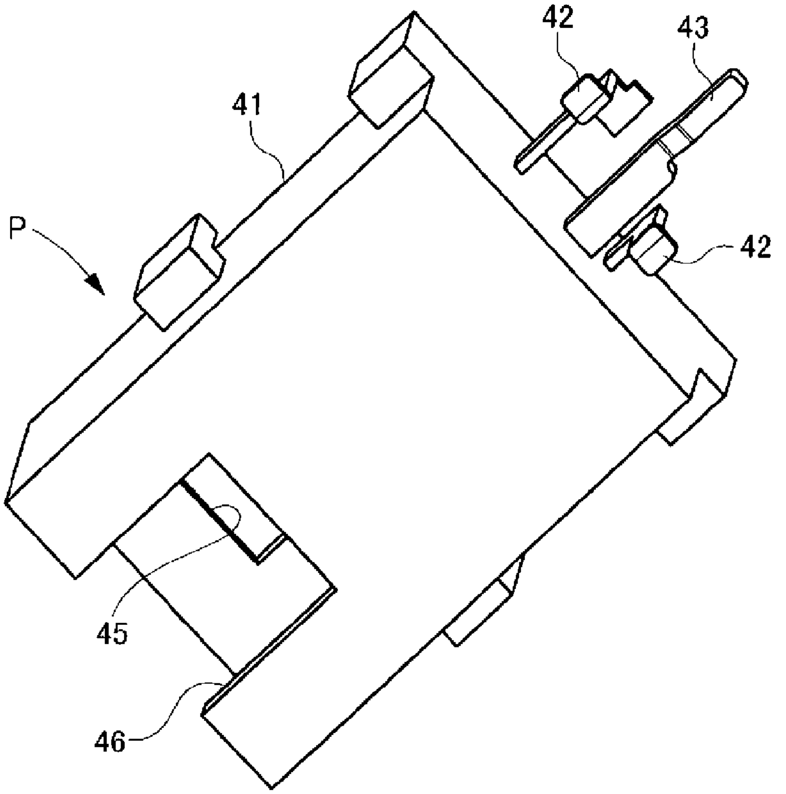
FIG. 3 is a perspective view in which the coaxial connector for the board shown in FIG. 1 is viewed from below.

Hereinafter, the coaxial connector for the board, the pair of chain terminals used for the coaxial connector for the board, and the manufacturing method of manufacturing the coaxial connector for the board according to an embodiment of the present invention will be described with reference to the drawings. As shown in FIGS. 1 to 3, a coaxial connector P for a board manufactured by the present embodiment includes an outer housing (a connector housing) 41, an outer terminal (an outer conductor terminal) 42, an inner housing (a dielectric body) 43, and an inner terminal (an inner conductor terminal) 44.

The outer housing 41 receives the outer terminal 42 in an inner portion thereof, and the inner terminal 44 is received in the inner portion of the outer terminal 42 via the inner housing 43. Herein, the outer housing 41 mainly covers the outer portion of the outer terminal 42, and the inner housing 43 covers the inner terminal 44. The outer terminal 42 and the inner terminal 44 are accommodated in a mold C described below, and are formed in a shape mentioned above by a hoop molding using a synthetic resin (an insulating material and a dielectric body) of the outer housing 41 and the inner housing 43.

The outer terminal 42 and the inner terminal 44 have substantially the same length over their overall lengths, and the outer housing 41 has a length sufficiently longer than the overall length of the outer terminal 42 and the inner terminal 44. A gap G1, into which an outer housing (not shown) of an opposite side connector can be inserted, is formed between the outer housing 41 and the outer terminal 42, and a gap G2, into which an inner housing (not shown) of an opposite side connector is inserted, is formed between the outer terminal 42 and the inner housing 43. Additionally, a gap G3, into which an inner terminal (not shown) of an opposite side connector is inserted, is formed between the inner housing 43 and the inner terminal 44. A top portion and a bottom portion of the outer housing 41 are formed with fitting holes 45 fitted to locking portions of the opposite side connector, guide recesses 46 guiding the opposite side connector into the outer housing 41 during fitting or the like.

Next, the details of the coaxial connector P for the board of the configuration mentioned above, and the manufacturing method of manufacturing the coaxial connector P for the board will be described with reference to FIGS. 4 to 17. As shown in FIGS. 4 to 8, with regard to the manufacturing method of the coaxial connector for the board, an outer terminal A with a carrier and an inner terminal B with a carrier obtained by the press molding of the conductive metal plate are prepared, and these terminals are used so as to overlap each other. Furthermore, in FIGS. 4 to 8, a case is shown where one outer terminal A or inner terminal B is extended to the carrier. However, in the carrier, a plurality of outer terminals A or a plurality of inner terminals B is extended to one side of the carrier in a chain shape. In this manner, a configuration, in which the plurality of outer terminals A or the plurality of inner terminals B is extended in a chain shape, is called a chain terminal. Furthermore, hereinafter, the outer terminal A or the inner terminal B, which is in the state of being extended to the carrier, is called the outer terminal A with the carrier or the inner terminal B with the carrier.

Figure 4:
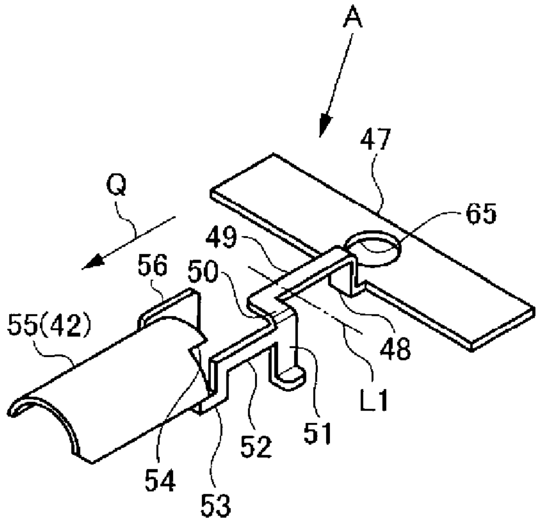
FIG. 4 is a perspective view of an outer terminal (with a carrier) used for the coaxial connector for the board according to the embodiment of the present invention.

As shown in FIG. 4, the outer terminal A with the carrier has a rising portion 48 which is raised from a side edge of a band-like carrier 47 in one plane at a predetermined height, a horizontal portion 49 which is substantially horizontally extended from the upper end of the rising portion 48 in the width direction (direction of the arrow Q), a short piece portion 50 which is extended to the side portion of the horizontal portion 49 end in a direction substantially perpendicular to the horizontal portion 49, an L-shaped portion 51 which is extended vertically downward in the short piece portion 50 and is formed in a substantially L shape, an extended portion 52 which is extended from the middle of the L-shaped portion 51 in the direction of the arrow Q (a horizontal direction) of the carrier 47 and is in the same plane as the L-shaped portion 51, a small L-shaped portion 53 which is continued from the extended portion 52 end vertically downward and is in the same plane as the extended portion 52, and a partial recess 54 which is extended to the L-shaped portion 53 end and faces the small L-shaped portion 53. Members from reference numeral 48 to reference numeral 53 are extended from the half-cylinder portion 55 opened downward (members from reference numeral 48 to reference numeral 53 are referred to as the extended portion). Moreover, the half-cylinder portion 55 is extended on the opposite side of the L-shaped portion 53 of the half-cylinder portion 55, and integrally includes a wide connection portion 56 rising in the vertical direction, and a protrusion portion 57 extended to the lower portion of the connection portion 56 end and forming a substantially L shape together with the connection portion 56. The half-cylinder portion 55 comes into contact with the outer terminal of the opposite coaxial connector, when fitting the coaxial connector for the board and the opposite coaxial connector according to an embodiment of the invention are fitted to each other. Furthermore, when the coaxial connector for the board according to an embodiment of the invention is mounted to the printed board, the L-shaped portion 51 is soldered to a GND line of the printed board.

Figure 5:
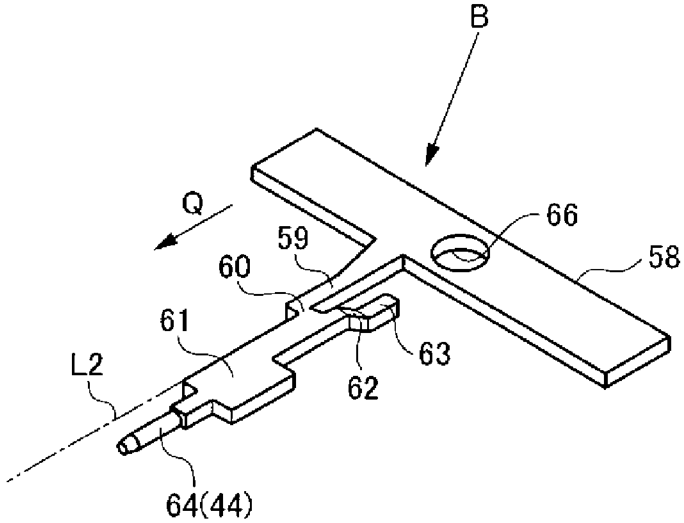
FIG. 5 is a perspective view of an inner terminal (with a carrier) used for the coaxial connector for the board according to the embodiment of the present invention.

Meanwhile, as shown in FIG. 5, the inner terminal B with the carrier integrally includes a horizontal portion 59 which is horizontally extended from one side edge of a band-like carrier 58 in one horizontal plane in the direction of the arrow Q, a support portion 61 which is continued to one side edge of the horizontal portion 59 end via the short connection portion 60 and is horizontally extended in the direction of arrow Q, a short slope portion 62 which is separated from the connection portion 60 and slopes downward in an opposite direction of the arrow Q over a predetermined length, and a horizontal portion 63 which is horizontally extended to the lower portion of the slope portion 62. A main body portion 64, in which a tip is processed in a truncated conical shape, is extended to end of the support portion 61 in the direction of the arrow Q (the members from reference numeral 59 to reference numeral 61 are referred to as extended portions). When fitting the coaxial connector for the board according to an embodiment of the present invention and the opposite coaxial connector, the main body portion 64 comes into contact with the inner terminal of the opposite coaxial connection. Furthermore, when the coaxial connector for the board according to an embodiment of the invention is mounted to the printed board, the horizontal portion 63 is soldered to the signal line of the printed board.

The length from the carrier 58 to the tip of the main body portion 64 and the length from the carrier 47 to the tip of the half-cylinder portion 55 are substantially equal to each other. The lengths (the widths) of the carriers 47 and 58 in the direction of the arrow Q are substantially equal to each other. Furthermore, the carrier 47 is formed with a positioning hole 65 in an opposite part of the rising portion 48, and the carrier 58 is formed with a positioning hole 66 in an opposite part of the horizontal portion 63. Accordingly, in a state where the carrier 47 is superimposed on the carrier 58 as shown in FIG. 6 so that the positioning holes 65 and 66 coincide with each other, the horizontal portion 59 and the horizontal portion 63 are placed so that they are not vertically superimposed on each other with respect to the horizontal portion 49.

Figure 6:
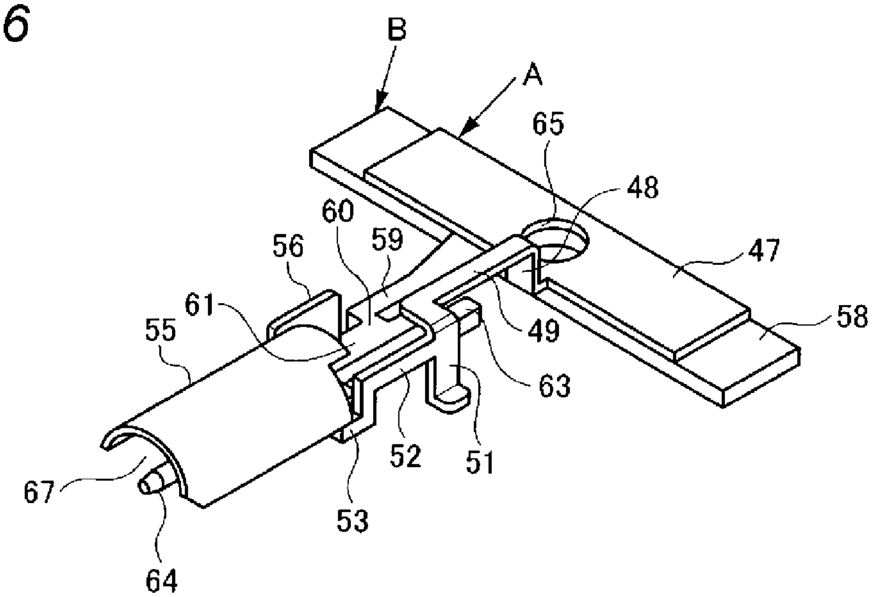
FIG. 6 is a perspective view of a state where the outer terminal and the inner terminal each shown in FIGS. 4 and 5 overlap each other vertically.
Figure 7:
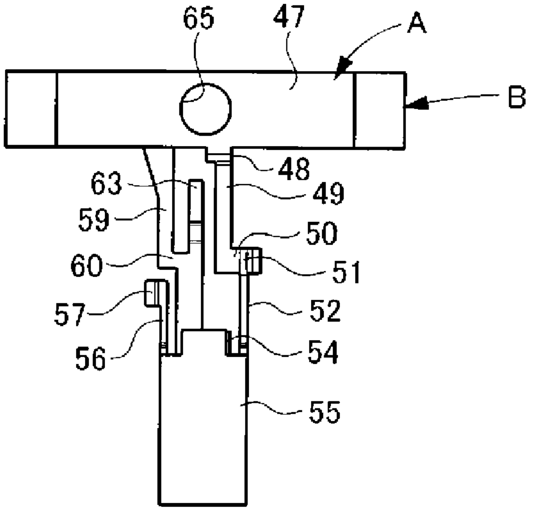
FIG. 7 is a plan view of the outer terminal and the inner terminal superimposed as shown in FIG. 6.
Figure 8:
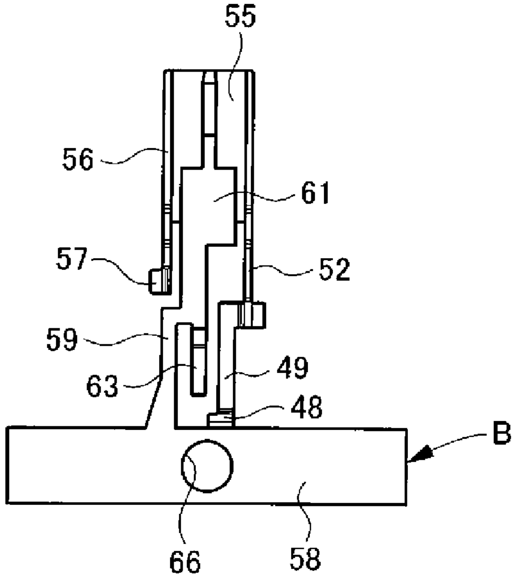
FIG. 8 is a bottom view of the outer terminal and the inner terminal superimposed as shown in FIG. 6.

FIGS. 6, 7 and 8 are a perspective view, a plan view and a bottom view that show a state where the outer terminal A with the carrier and the inner terminal B with the carrier are superimposed on each other, respectively. From the drawings, the horizontal portion 59, the horizontal portion 63, the connection portion 60 and a part (substantially, a half portion) of the support portion 61 of the inner terminal B with the carrier are not superimposed on the rising portion 48, the horizontal portion 49, the short piece portion 50, the L-shaped portion 51, the connection portion 52, and the L-shaped portion 53 of the outer terminal A with the carrier in the vertical direction, respectively. As a result, when a mold C described below is sandwiched between the outer terminal A with the carrier and the inner terminal B with the carrier of the superimposed state from up and down, and the outer terminal A with the carrier and the inner terminal B with the carrier are accommodated in the inner portion of the mold C, it is possible to sandwich the rising portion 48, the horizontal portion 49, the short piece portion 50, the L-shaped portion 51, the extended portion 52 and the L-shaped portion 53 of the outer terminal A with the carrier, and the horizontal portion 59, the horizontal portion 63, the connection portion 60 and a part (a substantially half portion) of the support portion 61 of the inner terminal B with the carrier from up and down. On the contrary, there is a location superimposed in the vertical direction, in this location, the upper mold comes into one of the inner terminal or the outer terminal positioned on the upper side and cannot be moved further downward than that, and the mold of the other side comes into contact with the one mold positioned on the lower side and cannot be moved further upward than that. For this reason, the location cannot be sealed by the mold, and when causing the insulating material to flow therein, the insulating material leaks from the location. In the present embodiment, since it is possible to sandwich the rising portion 48, the horizontal portion 49, the short piece portion 50, the L-shaped portion 51, the extended portion 52 and the L-shaped portion 53 of the outer terminal A with the carrier, and the horizontal portion 59, the horizontal portion 63, the connection portion 60 and a part (a substantially half portion) of the support portion 61 of the inner terminal B with the carrier from vertical, the outer terminal A and the inner terminal B can be sealed by the mold. Thus, when causing the insulating material to flow therein, the insulating material does not leak.

The remainder of the support portion 61 of the inner terminal B with the carrier and the main body portion 64 continued thereto face the center portion of the half-cylinder portion 55 in the outer terminal A with the carrier, and a gap 67 for an insulating material injection becoming the inner housing 43 is sandwiched between the main body portion 64 and the half-cylinder portion 55 as shown in FIG. 6.

Figure 9:
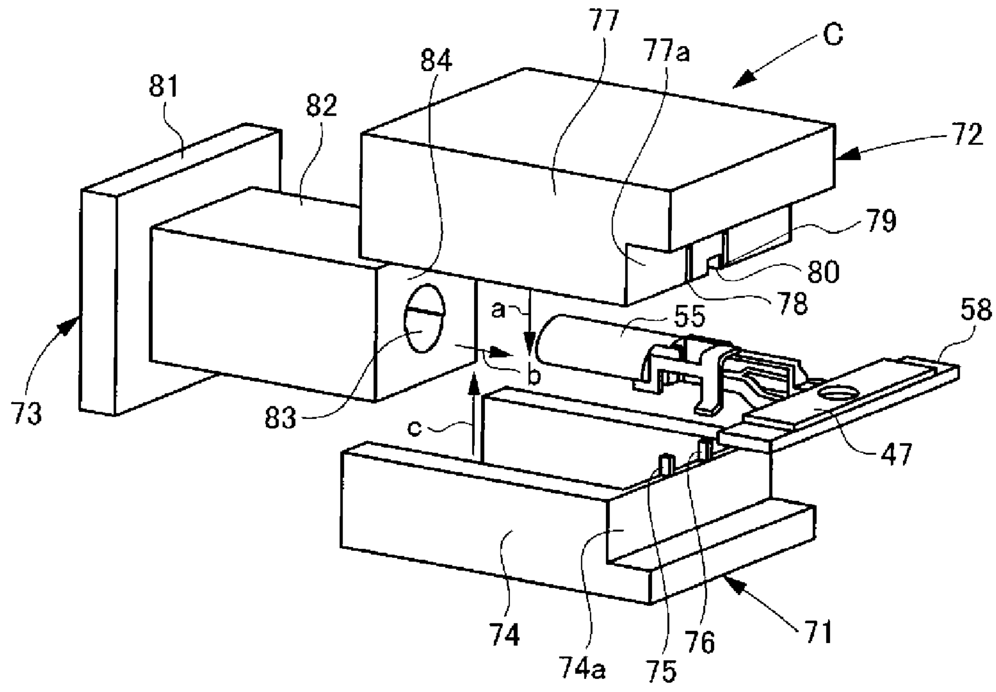
FIG. 9 is a perspective view that shows a mold used for manufacturing the coaxial connector for the board according to the embodiment of the present invention.

Next, a case will be described where the outer terminal A with the carrier and the inner terminal B with the carrier are received in the mold C, and the synthetic resin (the insulating material) is injected into the mold C to mold a hoop, based on FIGS. 9 to 12. As shown in FIG. 9, the mold C includes a lower mold 71, an upper mold 72, and a slide mold 73.

The lower mold 71 forms a substantially rectangular container shape opened upward and rearward. A pair of protrusions 75 and 76 is projected upward from an upper surface of a front wall 74*a* in the front of a U-shaped wall 74. The upper surface of the U-shaped wall 74 is an abutting surface relative to the upper mold 72 and thus is a flat surface.

The upper mold 72 forms a substantially rectangular container shape opened downward and rearward, and a front wall 77*a* of a front part of the U-shaped wall 77 is formed with a pair of slit grooves 78 and 79 falling in the front and back surfaces and the lower surface. The slit grooves 78 and 79 have sizes and shapes capable of fitting the extended portion 52 and the connection portion 56 of the outer terminal A with the carrier sandwiched between the lower mold 71 and the upper mold 72, and the protrusions 75 and 76 as described below. When the protrusions 75 and 76 are further fitted in a state where the extended portion 52 and the connection portion 56 are fitted, the inner portions of the slit grooves 78 and 79 are buried by the extended portion 52, the connection portion 56, and the protrusions 75 and 76. Furthermore, a rectangular notch 80 falling in the front and back surfaces and the lower surface is formed near the center portion of the front wall 77*a*. The notch 80 has a size and a shape capable of fitting the horizontal portion 59 of the inner terminal B with the carrier. When the horizontal portion 59 is fitted, the inner portion of the notch 80 is buried by the horizontal portion 59. In this manner, since the slit grooves 78, 79 and the notch 80 are in the buried state, the synthetic resin injected into the mold from here does not leak.

The slide mold 73 includes a substantially rectangular plate shielding portion 81 shown in FIG. 9 and a transverse cylinder portion 82 integrally projected from the front surface side of the plate shielding portion 81. The plate shielding portion 81 functions so as to seal the rear opening formed by the lower mold 71 and the upper mold 72 when the lower mold 71 and the upper mold 72 are closed. Furthermore, the transverse cylinder portion 82 has the external form of a rectangular cross-section, and the center portion thereof is formed with a substantially circular long hole 83 from the front side of the transverse cylinder portion 82 over a predetermined depth.

Herein, a thick portion 84 from an outer peripheral (outer) surface of the transverse cylinder portion 82 to the long hole 83 has a thickness and a shape corresponding to the gap G1 of the outer housing 41 shown in FIG. 2. Furthermore, a cylinder portion 85 of a predetermined length is projected from a lower center portion in the long hole 83 in the axial direction, and a cylinder portion 86 of a large diameter shorter than the cylinder portion 85 is projected from the outer peripheral direction of the cylinder portion 85 similarly in the axial direction.

The cylinder portion 85 has a thickness and a shape corresponding to the gap G3 shown in FIG. 2, and the cylinder portion 86 has a thickness and a shape corresponding to the gap G2 shown in FIG. 2. Furthermore, a gap G4 shown in FIG. 11, which is formed when the lower mold 71, the upper mold 72 and the slide mold 73 are closed (the molds are clamped), has a thickness and a shape corresponding to the outer housing 41 shown in FIG. 2.

Figure 10:
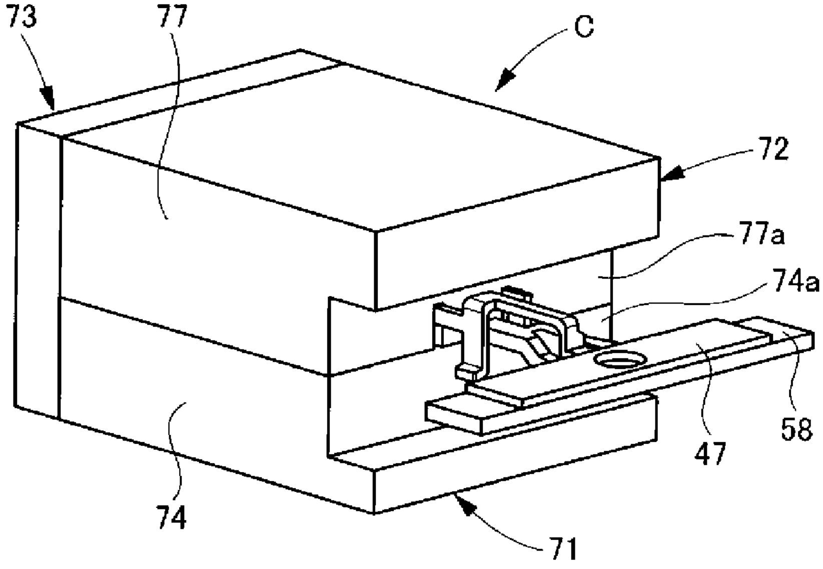
FIG. 10 is a perspective view that shows a state after closing the mold shown in FIG. 9.
Figure 11:
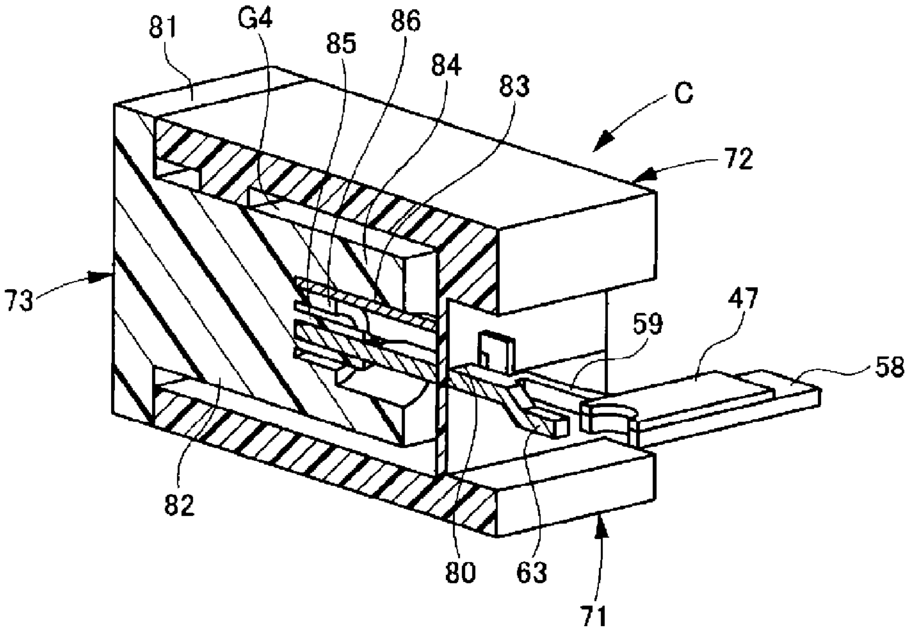
FIG. 11 is a longitudinal cross-sectional perspective view of the mold shown in FIG. 10.
Figure 12:
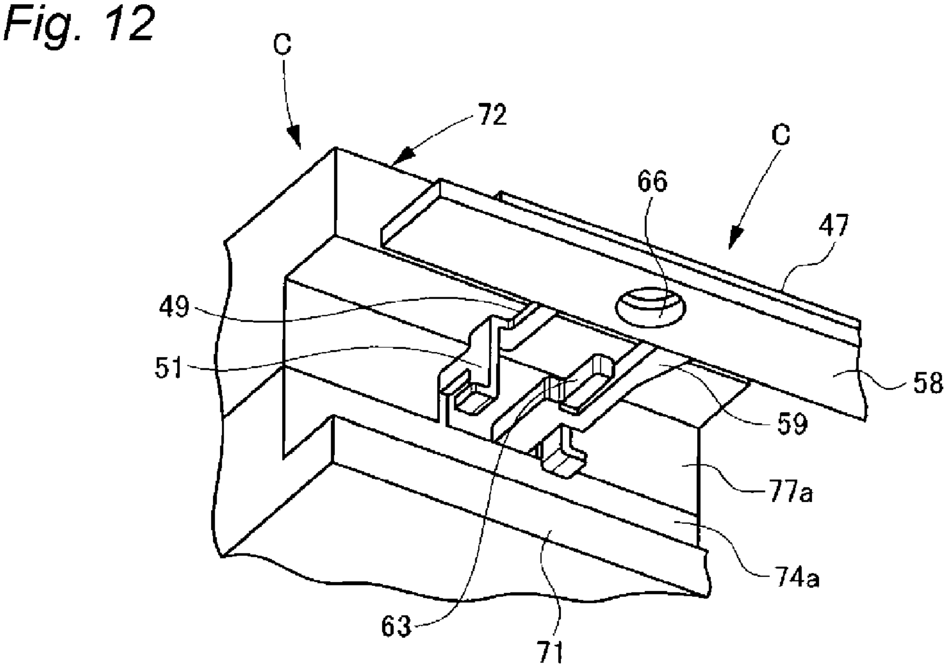
FIG. 12 is a perspective view in which the mold shown in FIG. 10 is viewed obliquely from below.

Thus, the outer terminal A with the carrier and the inner terminal B with the carrier, in which the carriers 47 and 58 are superimposed on each other, are placed between the lower mold 71 and the upper mold 72, the respective molds 71 and 72 are moved in the direction of arrows a and b of FIG. 9, and the slide mold 73 is inserted into the rear opening end sides of the respective molds 71 and 72 in the direction of the arrow c. As a result, as shown in FIGS. 10 and 11, the mold closing is performed in the state where the outer terminal A with the carrier and the inner terminal B with the carrier, in which the carriers 47 and 58 are superimposed on each other, surround the periphery thereof by the lower mold 71, the upper mold 72 and the slide mold 73. Next, the insulating material (the synthetic resin) is injected into the gaps G1 to G4 surrounded by the respective molds 71 and 72 using a known method. When closing the mold, the respective molds 71 to 73 are joined to each other in a sealed manner, and the extended portion 52 and the connection portion 56 of the outer terminal A with the carrier and the protrusions 75 and 76 of the lower mold 71 are inserted into the slit grooves 78 and 79 of the upper mold 72 in a sealed contact state. For this reason, the insulating material injected into the respective molds 71 to 73 does not leak to the outside.

Figure 13:
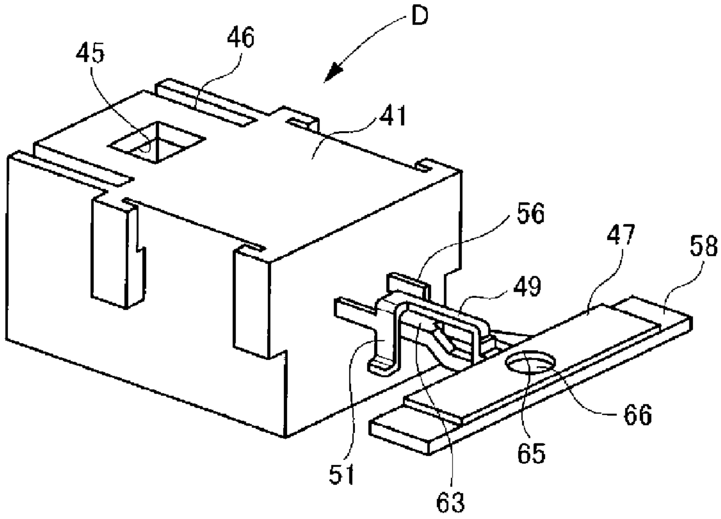
FIG. 13 is a perspective view that shows the coaxial connector for the board with the carrier in which the mold is opened.
Figure 14:
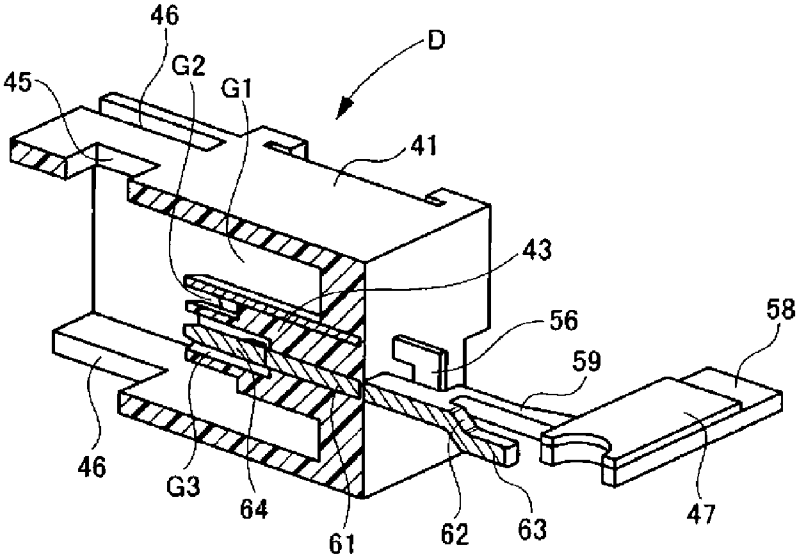
FIG. 14 is a longitudinal cross-sectional perspective view of the coaxial connector for the board with the carrier shown in FIG. 13.

Moreover, the mold is opened by moving the respective molds 71 to 73 in an opposite direction to the direction of arrows a to c after the solidification of the synthetic resin. As a consequence, the coaxial connector D for the board with the carrier as shown in FIGS. 13 and 14 is formed.

Figure 15:
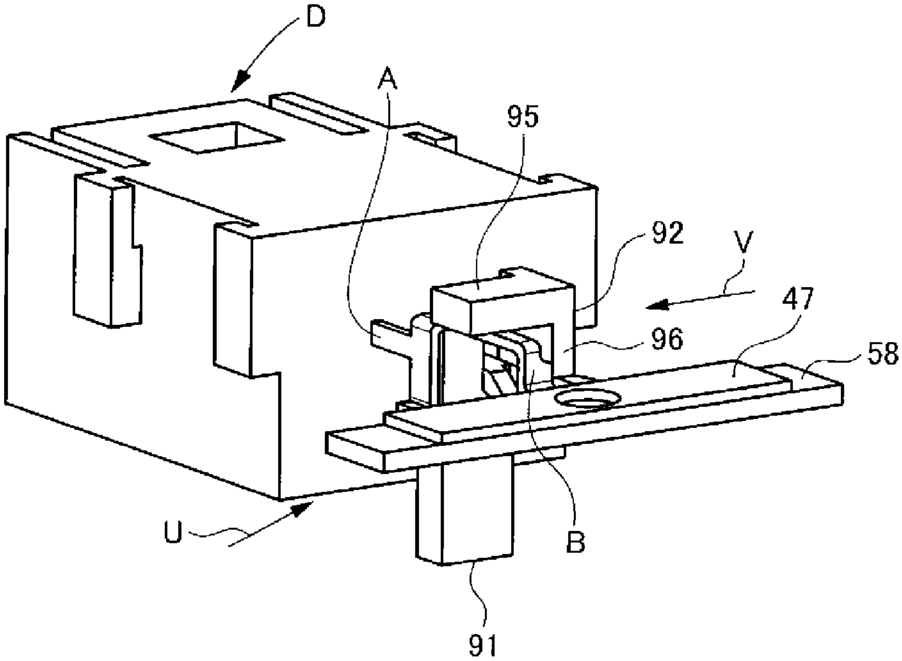
FIG. 15 is a perspective view that shows an arrangement situation of a carrier cut mold relative to the coaxial connector for the board with the carrier shown in FIG. 13.
Figure 16:
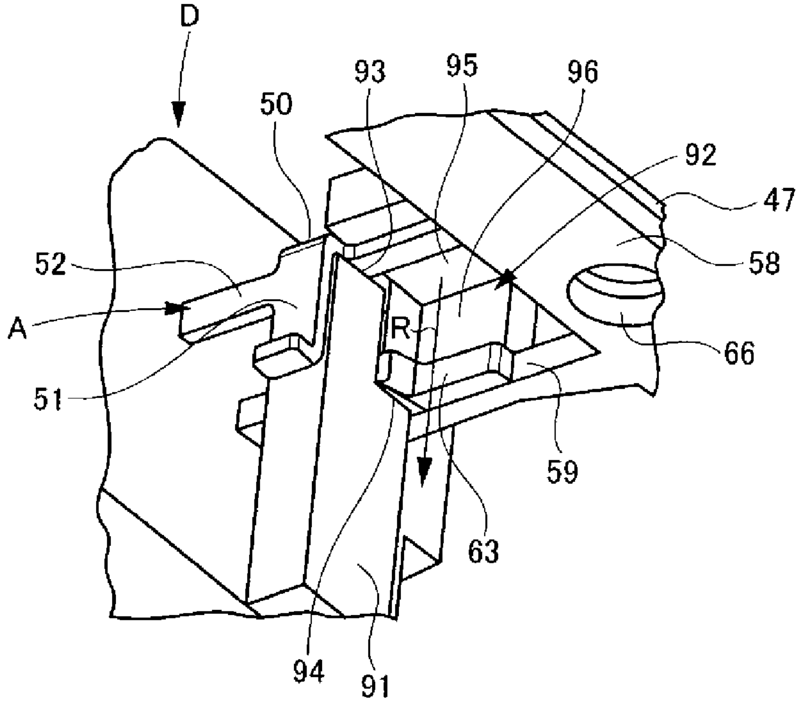
FIG. 16 is a perspective view in which the carrier cut mold shown in FIG. 15 is viewed from the direction of the arrow U.
Figure 17:
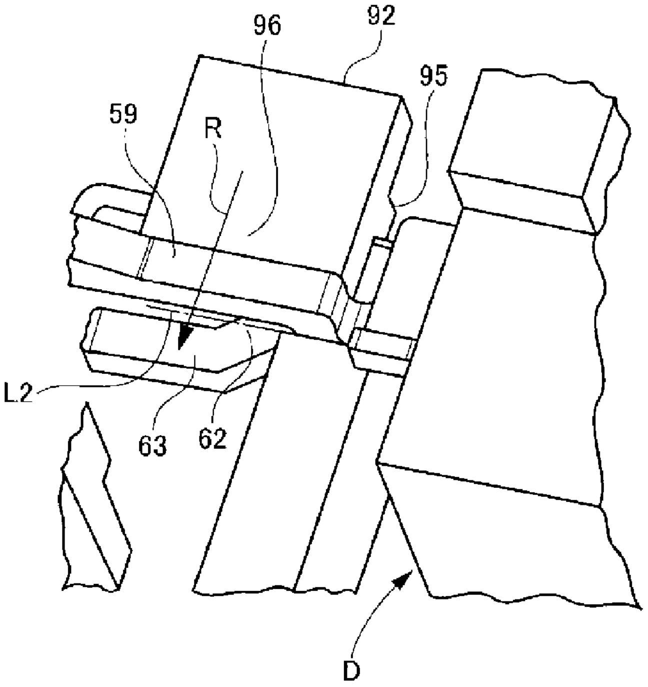
FIG. 17 is a perspective view in which the carrier cut mold shown in FIG. 15 is viewed from the direction of the arrow V.
Figure 18:
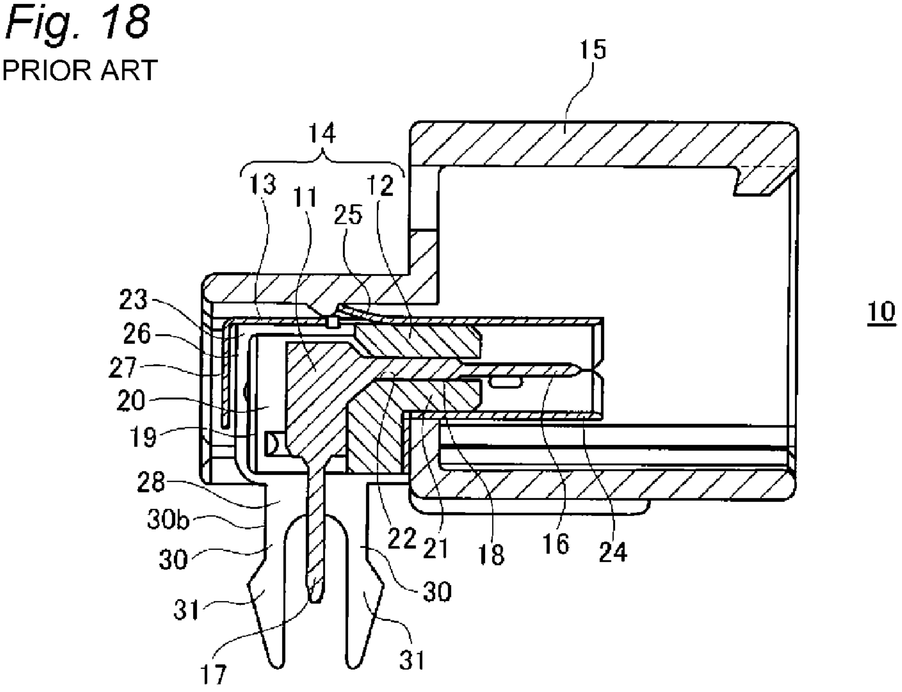
Fig. 18 PRIOR ART
FIG. 18 is a longitudinal cross-sectional view of a shield connector for a board of the conventional art.

Next, as shown in FIGS. 15 to 17, with respect to the coaxial connector D for the board with the carrier as mentioned above, the outer terminal A with the carrier and the inner terminal B with the carrier are cut by using the carrier cut lower mold 91 and the carrier cut upper mold 92. The carrier cut lower mold 91 is formed in formed in an L shape at the upper end portion thereof by a steel material of a predetermined thickness, an upper side thereof becomes an upper blade 93, and a lower side thereof becomes a lower blade 94. A blade edge of the upper blade 93 supports a portion continued to the short piece portion 50 of the horizontal portion 49 of the outer terminal A with the carrier from below, and a blade edge of the lower edge 94 supports a portion in which the horizontal portion 59 of the inner terminal B with the carrier is continued to the connection portion 60, and a portion in which the horizontal portion 63 is continued to the slope portion 62, from below.

Furthermore, the carrier cut upper mold 92 includes a horizontal blade 95 and a vertical blade 96 having an L shape in the vertical direction through a steel material of a predetermined thickness. The respective blade edges of the horizontal blade 95 and the vertical blade 96 are provided at a position facing the upper blade 93 and the lower blade 94 of the carrier cut lower mold 91, and are held in a positional relationship in which the carrier cut upper mold 92 does not interfere with the carrier cut lower mold 91 in the vertical direction.

Thus, the carrier cut lower mold 91 and the carrier cut upper mold 92 are placed with respect to the outer terminal A with the carrier and the inner terminal B with the carrier of the coaxial connector D for the board with the carrier, as mentioned above. Moreover, the carrier cut upper mold 92 is hit down against the carrier cut lower mold 91 in the direction of arrow R. As a result, the outer terminal A with the carrier is cut by a cut line 1 of FIG. 4, and at the same time, the inner terminal B with the carrier is cut by a cut line 2, whereby the coaxial connector P for the board as shown in FIGS. 1 to 3 is obtained.

This is more like predominantly acts, even when cutting the outer terminal A with the carrier and the inner terminal B with the carrier, the horizontal portion 59, the horizontal portion 63, the connection portion 60 and a part (substantially a half portion) of the support portion 61 of the inner terminal B with the carrier are not vertically superimposed on the rising portion 48, the horizontal portion 49, the short piece portion 50, the L-shaped portion 51, the extended portion 52, and the L-shaped portion 53 of the outer terminal A with the carrier. That is, if there is a location superimposed in the vertical direction, in that location, one of the inner terminal and the outer terminal is pressed against the carrier cut lower mold or the carrier cut upper mold and is folded, and is cut in this state. In this case, the inner terminal or the outer terminal is unintentionally deformed. Moreover, even if the deformation is allowed, the inner terminal and the outer terminal may communicate with each other in the cut location. In the present embodiment, when cutting the outer terminal A with the carrier and the inner terminal B with the carrier, it is possible to prevent the inner terminal or the outer terminal being unintentionally deformed and the inner terminal and the outer terminal communicate with each other.

As mentioned above, with the coaxial connector P for the board according to the embodiment of the invention, the coaxial connector for the board can be manufactured by the process smaller than the number of processes required for manufacturing the coaxial connector for the board of the related art. As a consequence, the manufacturing cost of the coaxial connector for the board and the selling cost can be lowered, and the board can be cheaply supplied to a market.

The invention has been described with reference to the specific embodiment in detail, but it is apparent to those skilled in the art that various modification and alterations can be added without departing from the gist and the scope of the invention.

The present invention is based on Japanese Patent Application No. 2009-255276 filed on Nov. 6, 2009, the contents of which are incorporated byway of reference.

Reference Signs List

41: outer housing
42: outer terminal
43: inner housing
44: inner terminal
47, 58: carrier
55: half-cylinder portion
59: horizontal portion
71: lower mold
72: upper mold
73: slide mold
74, 77: U-shaped wall
74*a*, 77*a*: front wall

75, 76: protrusion
78, 79: slit groove
80: notch
84, 85: cylinder portion
91: carrier cut lower mold
92: carrier cut upper mold
93: upper blade
94: lower blade
95: horizontal blade
96: vertical blade
A: outer terminal with carrier
B: inner terminal with carrier
C: mold
D: coaxial connector for board with carrier
G1 to G4: gap
P: coaxial connector for board

The invention claimed is:

1. A coaxial connector for a board, configured to be attached to a printed board, the coaxial connector comprising:

an outer terminal;

an inner terminal; and an insulating material positioned between the outer terminal and the inner terminal and on an outside of the outer terminal, wherein the outer terminal includes a half-cylinder portion in which a part of a lower side thereof is removed, and an extended portion including a first portion which is extended from the half-cylinder portion in a direction along a longitudinal axis of the half-cylinder portion and a second portion which is extended from the first portion toward the printed board in a state where the coaxial connector is attached to the printed board, the inner terminal includes a main body portion which can be accommodated into the half-cylinder portion of the outer terminal through the part of the lower side thereof, and an extended portion including a third portion which is extended from the main body portion in a direction along the longitudinal axis of the half-cylinder portion and a fourth portion which is extended from the third portion toward the printed board in the state where the coaxial connector is attached to the printed board, and the extended portion of the outer terminal and the extended portion of the inner terminal are in a position where one of the two extended portions is not superimposed on the other of the two extended portions when the half-cylinder portion of the outer terminal is viewed from an upper side.

2. A pair of chain terminals comprising:

a first chain terminal in which an outer terminal is extended from a first carrier in a chain shape; and a second chain terminal in which an inner terminal is extended from a second carrier in a chain shape, wherein the outer terminal has a half-cylinder portion in which a part of a lower side thereof is removed, and an extended portion which is extended from the half-cylinder portion toward the first carrier, the inner terminal has a main body portion which can be accommodated into the half-cylinder portion of the outer terminal through the part of the lower side thereof, and an extended portion which is extended from the main body portion toward the second carrier, and in a state where the first chain terminal and the second chain terminal are stacked so that the second carrier is positioned on the lower side of the first carrier, the main body portion of the inner terminal is accommodated in the half-cylinder portion of the outer terminal, and the extended portion of the outer terminal and the extended portion of the inner terminal are in a position where one of the two extended portions is not superimposed on the other of the two extended portions when viewing the half-cylinder portion of the outer terminal from an upper side.

3. A method of manufacturing a coaxial connector for a board to be attached to a printed board, from a first chain terminal in which an outer terminal having a half-cylinder portion with a part of a lower side removed and an extended portion extended from the half cylinder portion toward a first carrier is extended from the first carrier in a chain shape, and a second chain terminal in which an inner terminal having a main body portion capable of being accommodated into the half-cylinder portion of the outer terminal from a part of a lower side thereof and an extended portion extended from the main body portion toward a second carrier is extended from the second carrier in a chain shape, the manufacturing method comprising:

accommodating the main body portion of the inner terminal into the half-cylinder portion of the outer terminal, by stacking the first chain terminal and the second chain terminal so that the second carrier is positioned on the lower side of the first carrier;

storing the first chain terminal and the second chain terminal in a mold so as to surround the half-cylinder portion of the outer terminal and a periphery of the main body portion of the inner terminal, and sandwich the extended portion of the outer terminal and the extended portion of the inner terminal, which are in a position where one of the two extended portions is not superimposed on the other of the two extended portions when the half-cylinder portion of the outer terminal is viewed from an upper surface, from a vertical direction, respectively, and;

injecting an insulating material into the mold in which the first chain terminal and the second chain terminal are stored to perform a hoop molding; and cutting the extended portion of the outer terminal and the extended portion of the inner terminal.

* * * * *